United States Patent
Shirahata et al.

(10) Patent No.: US 8,478,021 B2
(45) Date of Patent: Jul. 2, 2013

(54) CHARGED BEAM DEVICE

(75) Inventors: Kaori Shirahata, Mitaka (JP);
Yoshinori Nakayama, Sayama (JP);
Keiichiro Hitomi, Delmar, NY (US);
Muneyuki Fukuda, Kokubunji (JP);
Yasunari Sohda, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 179 days.

(21) Appl. No.: 13/142,316

(22) PCT Filed: Jan. 13, 2010

(86) PCT No.: PCT/JP2010/000133
§ 371 (c)(1),
(2), (4) Date: Jun. 27, 2011

(87) PCT Pub. No.: WO2010/082477
PCT Pub. Date: Jul. 22, 2010

(65) Prior Publication Data
US 2011/0274341 A1    Nov. 10, 2011

(30) Foreign Application Priority Data

Jan. 15, 2009 (JP) .................................. 2009-006301

(51) Int. Cl.
*G06K 9/00* (2006.01)
*G06K 9/40* (2006.01)

(52) U.S. Cl.
USPC .......................................... 382/141; 382/255

(58) Field of Classification Search
USPC .................... 382/141–145, 181, 255
See application file for complete search history.

(56) References Cited

U.S. PATENT DOCUMENTS

| | | | |
|---|---|---|---|
| 6,259,960 B1* | 7/2001 | Inokuchi | 700/110 |
| 7,348,558 B2* | 3/2008 | Watanabe et al. | 250/310 |
| 2002/0179851 A1 | 12/2002 | Sato et al. | |
| 2005/0253083 A1* | 11/2005 | Sato et al. | 250/398 |
| 2006/0151698 A1* | 7/2006 | Sasaki et al. | 250/310 |
| 2007/0024528 A1 | 2/2007 | Kobaru et al. | |

FOREIGN PATENT DOCUMENTS

| | | |
|---|---|---|
| JP | 8-31364 A | 2/1996 |
| JP | 8-306330 A | 11/1996 |
| JP | 10/154479 A | 6/1998 |
| JP | 10-162761 A | 6/1998 |
| JP | 2001-6599 A | 1/2001 |
| JP | 2001-110347 A | 4/2001 |
| JP | 2003-346698 A | 12/2003 |
| JP | 2006-108123 A | 4/2006 |
| JP | 2007-59370 A | 3/2007 |

* cited by examiner

*Primary Examiner* — Daniel Mariam
(74) *Attorney, Agent, or Firm* — Mattingly & Malur, PC

(57) ABSTRACT

In order to provide a charged beam device capable of obtaining a precise image of a sample surface pattern while improving the accuracy of automatic focus/astigmatism correction, there are provided an electron gun (1), a deflection control portion (8) which allows an electron beam to scan, a focus control portion (10) and an astigmatism correction portion (3) for the electron beam, an image processing portion (11), and a switching portion (9) which switches scan conditions when obtaining pattern information of the sample (1001) surface and scan conditions when performing the automatic focus/astigmatism correction, and a scan speed and scan procedures are switched between when obtaining the pattern information and when performing the automatic focus/astigmatism correction.

15 Claims, 9 Drawing Sheets

CHARGED BEAM DEVICE

BACKGROUND OF THE INVENTION

1. Field of the Invention

The present invention relates to a charged beam device which observes the surface shape and composition of a sample using a charged beam.

2. Description of the Related Art

In manufacturing processes of a semiconductor device, circuit patterns are formed on wafers by lithography, etching and the like. In order to control the dimension accuracy of the patterns formed by each process and to find defects as soon as possible, inspection of the patterns on the wafers (samples) are carried out after these processes. In such inspection in production lines, it is impossible to inspect all circuit patterns. Thus, in general, a part of the patterns that is important in performance of the semiconductor device is extracted for inspection. On the other hand, it is necessary to improve the inspection accuracy with the patterns of the semiconductor device more complicated and miniaturized. However, an increase in inspection time to improve the inspection accuracy results in an increase in the number of parts on the wafers necessary for inspection. Thus, the throughput of an inspection device is extremely deteriorated. Therefore, it is necessary to satisfy the inspection accuracy and throughput at the same time.

Taking an example of an electron beam inspection device that inspects pattern widths as a scanning electron microscope that is one of general charged beam devices, an electron beam is irradiated onto a wafer to scan inspection regions, and an image is formed on the basis of position information and intensity information obtained by measuring, at each position, the intensity of reflected electrons or secondary electrons generated on a wafer surface by irradiation of electron beams. The pattern dimensions observed on the image are measured.

It should be noted that charged beam devices such as scanning electron microscopes are disclosed in, for example, Japanese Patent Application Laid-Open Publication Nos. H08-306330, H08-031364, 2001-006599, 2001-110347, and H10-154479.

PRIOR ART DOCUMENTS

Patent references

Patent reference 1: Japanese Patent Application Laid-Open Publication No. H08-306330
Patent reference 2: Japanese Patent Application Laid-Open Publication No. H08-031364
Patent reference 3: Japanese Patent Application Laid-Open Publication No. 2001-006599
Patent reference 4: Japanese Patent Application Laid-Open Publication No. 2001-110347
Patent reference 5: Japanese Patent Application Laid-Open Publication No. H10-154479

SUMMARY OF THE INVENTION

In the case of length measurement inspection for measuring pattern widths, a step of moving to a measurement region by movement of a stage (sample stage), a step of performing focus correction or astigmatism correction, or both of them (hereinafter, referred to as automatic focus/astigmatism correction), and a step of obtaining a length measurement image are repeated the number of times corresponding to the number of measurement points. Thus, executing these steps required for every inspection at a high speed and high accuracy is an important issue in performance of the charged beam device such as throughput and measurement accuracy.

Especially in measurement of an insulating material, there occur focus measurement errors in the automatic focus/astigmatism correction step due to charge-up on a wafer surface, and deterioration in the measurement accuracy caused by the errors is a serious problem. The charge-up of a wafer causes the trajectory of charged particles to be bent in the electrical field generated by charge, and causes measurement errors in the automatic focus/astigmatism correction step. If focus shifts or astigmatism occurs due to the measurement errors, the length measurement image to be obtained thereafter blurs, resulting in length measurement errors.

Improvement of the measurement accuracy in the automatic focus/astigmatism correction step leads to high-accuracy length measurement. Thus, it is conceivable that high-accuracy automatic focus/astigmatism correction is an important issue.

However, in fact, the same scan speed, the same scan method, and the same number of frames are used in the automatic focus/astigmatism correction step and the length measurement step. This is because the patterns on the wafers and the material of the wafers were simple as compared to current ones. Thus, it is conceivable that the impacts of the charge-up did not become apparent and the requirements of dimension accuracy in the manufacturing processes of the semiconductor device were not strict as compared to current ones.

It should be noted that the above-described Japanese Patent Application Laid-Open Publication No. H08-306330 and Japanese Patent Application Laid-Open Publication No. H08-031364 disclose a technique in which a scan speed is switched in order to improve the S/N ratio of an image obtained in the automatic focus/astigmatism correction step. In the case where the S/N ratio (intensity ratio of signal to noise) of profile data obtained from the image is low, the scan speed is reduced or the number of scan lines are increased, so that the S/N ratio of the data is increased to realize the improvement of the accuracy of the automatic focus/astigmatism correction. In the technique, a large amount of electron beam is irradiated onto a sample to improve the S/N ratio of the image data used for the automatic focus/astigmatism correction. However, in the technique of Japanese Patent Application Laid-Open Publication No. H08-306330 and Japanese Patent Application Laid-Open Publication No. H08-031364, the S/N ratio of the image is improved by a unit that reduces the scan speed in the automatic focus/astigmatism correction step, resulting in a large amount of electron beam irradiated onto the sample. Therefore, when observing patterns formed of insulating films such as resists, the amount of charge-up of the sample is increased due to an increase in the irradiation amount of electron beam, and no precise images can be obtained due to deterioration of signals at pattern edge portions.

Japanese Patent Application Laid-Open Publication No. 2001-006599 and Japanese Patent Application Laid-Open Publication No. 2001-110347 disclose a technique in which a scan pattern to be used in the automatic focus/astigmatism correction step is selected among those held in advance in accordance with the surface structure of a sample. High-accuracy automatic focus/astigmatism correction becomes possible by using the technique. However, there is no consideration of deterioration of contrast due to thinning of the number of lines and the impacts of the local charge-up generated between scan lines. Therefore, deterioration of measurement accuracy such as measurement errors in the automatic focus/astigmatism correction occurs due to deterioration of the contrast and local charge-up.

Further, as an attempt to increase the speed of measurement, Japanese Patent Application Laid-Open Publication No. H10-154479 proposes thinning of the number of scan lines in the automatic focus/astigmatism correction step. This device patent relates to a scanning electron microscope including an electron beam control unit which allows an electron beam to scan a sample while skipping at predetermined intervals, and a focus control unit which changes the focus on the sample. In this method, the scan method is changed between the automatic focus/astigmatism correction step and the length measurement step. With the use of this method, if the skip scan is performed for the sample surface with the electron beam, the number of scan lines is reduced, and thus time required for the automatic focus/astigmatism correction is shortened. However, in the method disclosed in Japanese Patent Application Laid-Open Publication No. H10-154479, there is a risk that pattern edge portions are not scanned by thinning the number of scan lines, and there is a problem in stability of the focus/astigmatism correction accuracy.

An object of the present invention is to provide a charged beam device by which the accuracy is improved in both or either of the focus correction and the astigmatism correction, and a precise image of the sample surface pattern can be obtained.

According to an aspect of the present invention to achieve the above-described object, there is provided a charged beam device including: a charged beam generator; a deflection control portion which allows a charged beam generated by the charged beam generator to scan; a focus control portion and an astigmatism correction portion for the charged beam; and an image processing portion which processes an image of surface information of a sample when irradiating the charged beam onto the sample, wherein there is further provided a switch portion which switches scan conditions for the charged beam when obtaining pattern information of the sample surface and scan conditions for the charged beam when performing both or either of focus correction and astigmatism correction, and a scan speed in the scan conditions for the charged beam when performing both or either of the focus correction and the astigmatism correction is set at a value larger than that in the scan conditions for the charged beam when obtaining the pattern information of the sample surface.

Further, according to another aspect of the present invention, there is provided a charged beam device including: a charged beam generator; a deflection control portion which allows a charged beam generated by the charged beam generator to scan; a focus control portion and an astigmatism correction portion for the charged beam; and an image processing portion which processes an image of surface information of a sample when irradiating the charged beam onto the sample, wherein there is further provided a switch portion which switches scan conditions for the charged beam when obtaining pattern information of the sample surface and scan conditions for the charged beam when performing both or either of focus correction and astigmatism correction, and a scan line interval in the scan conditions for the charged beam when performing both or either of the focus correction and the astigmatism correction is set in such a manner that scanning is performed at the integral multiple (excluding 1) of the scan line interval for scanning, and then the scanning is performed by returning to a skipped position for scanning.

According to the present invention, it is possible to provide a charged beam device by which the accuracy is improved in both or either of the focus correction and the astigmatism correction, and a precise image of the sample surface pattern can be obtained.

DETAILED DESCRIPTION OF THE INVENTION

The present invention has been achieved on the basis of the following knowledge. A response from a detector and electric power noise causing a problem when obtaining a precise pattern image cause no problem in focus correction and astigmatism correction, and thus scan conditions under which the contrast and position of an image can be obtained can be determined without concern for the response from the detector and the electric power noise in the focus correction and the astigmatism correction.

The present invention will be described below using embodiments. It should be noted that a main step of obtaining an inspection image is referred to as a length measurement step in each embodiment. This step generally indicates a step of allowing a charged particle beam to scan at a measurement region, and the object thereof may be not only to measure the length, but also to arbitrarily obtain information of the shape and material of a pattern. In addition, the present invention can be applied to not only a scanning electron microscope, but also a device which allows a charged beam to scan, such as a scanning ion microscope.

First Embodiment

Figure 1:
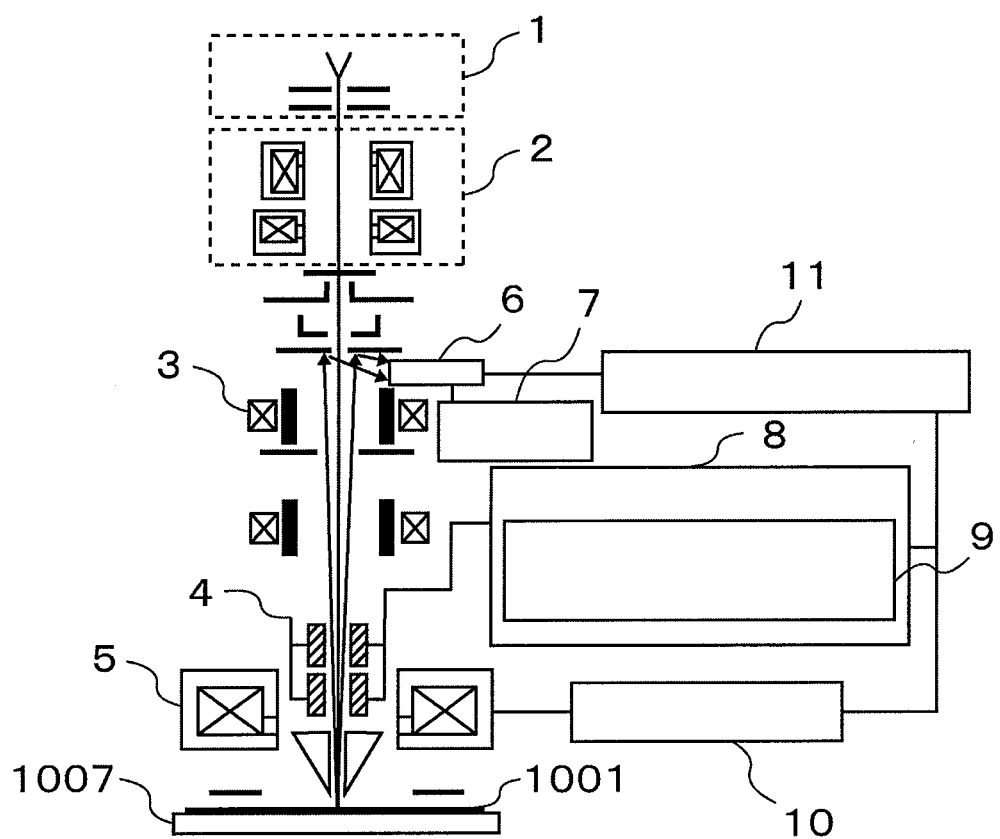
FIG. 1 is a conceptual diagram of a scanning electron microscope according to a first embodiment.

An embodiment of a scanning electron microscope that is one of charged beam devices will be described using the drawings. FIG. 1 shows an outlined configuration of a scanning electron microscope in the embodiment. The scanning electron microscope includes an electron gun (charged beam generator) 1 which generates an electron beam, a focusing lens 2 which allows the electron beam to be focused on a sample surface, an astigmatism correction device 3 which corrects astigmatism, a deflector 4 which allows the electron beam to scan on the sample surface, an objective lens 5 which allows the electron beam to be focused on the sample surface, a stage (sample stage) 1007, a detector 6 which detects secondary electrons emitted from the sample surface, a monitor 7 which displays a signal detected by the detector 6 as an image, an electron beam deflection control portion 8 which controls the irradiation position of the electron beam, a length measurement/automatic focus/astigmatism correction setting switching portion 9 which sets a scan method and a scan speed at the time of automatic focus/astigmatism correction and length measurement, a focus control portion 10 which controls the focus of the objective lens 5, and a CPU (image processing portion) 11 which processes the image generated from the signal detected by the detector 6 to calculate a focal point.

Figure 2:
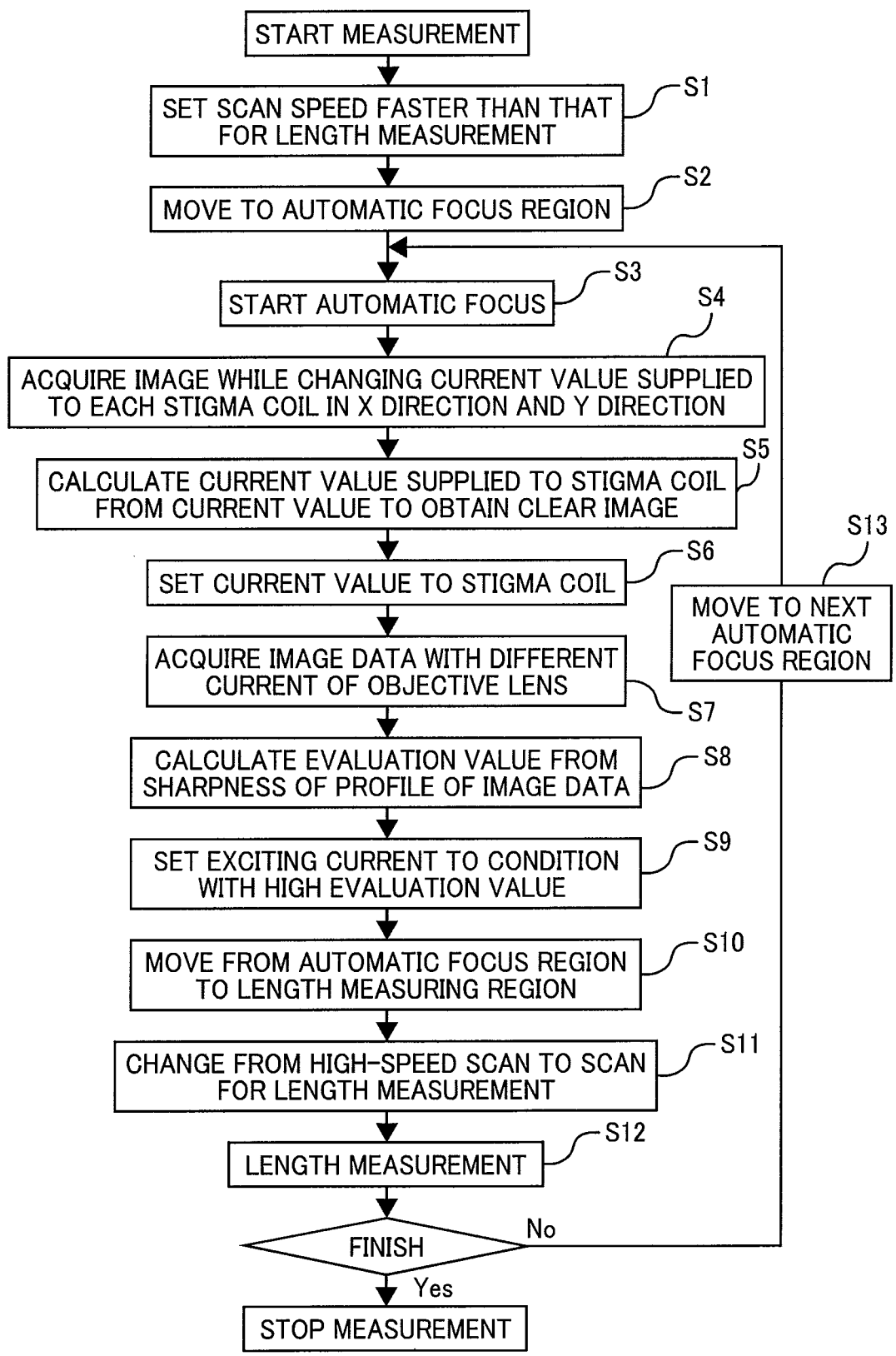
FIG. 2 is a flowchart for showing processing procedures of automatic focus/astigmatism correction and length measurement according to the first embodiment.
Figure 10:
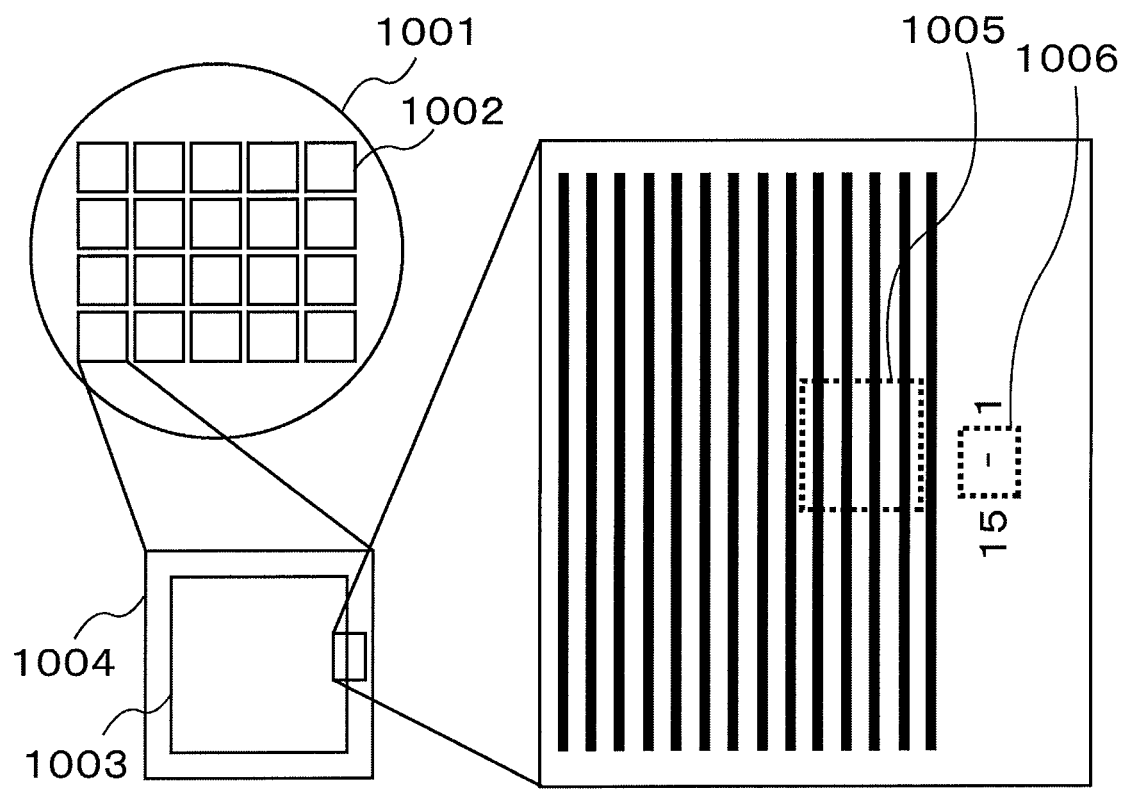
FIG. 10 is a plan view for schematically showing a pattern layout according to the first embodiment.

Next, the embodiment will be described in accordance with a pattern layout of FIG. 10 and a flowchart of FIG. 2. In the embodiment, one point was measured per chip among 20 chips provided on a wafer 1001. A pattern layout number is described in each chip 1002 at a scribe region 1004 near a line-and-space pattern of a device region 1003 to be measured. The focus correction and the astigmatism correction require a 2-dimensional pattern. Thus, the focus correction and the astigmatism correction were carried out using a rectangular pattern formed between numbers. However, the selection method of the pattern is not limited to the embodiment. A pattern itself to be measured may be used in the case of a hole pattern, and ends of a line are used and a focus/astigmatism correction region 1006 is overlapped with a length measurement region 1005 in the case of a line pattern in some cases.

Figure 3:
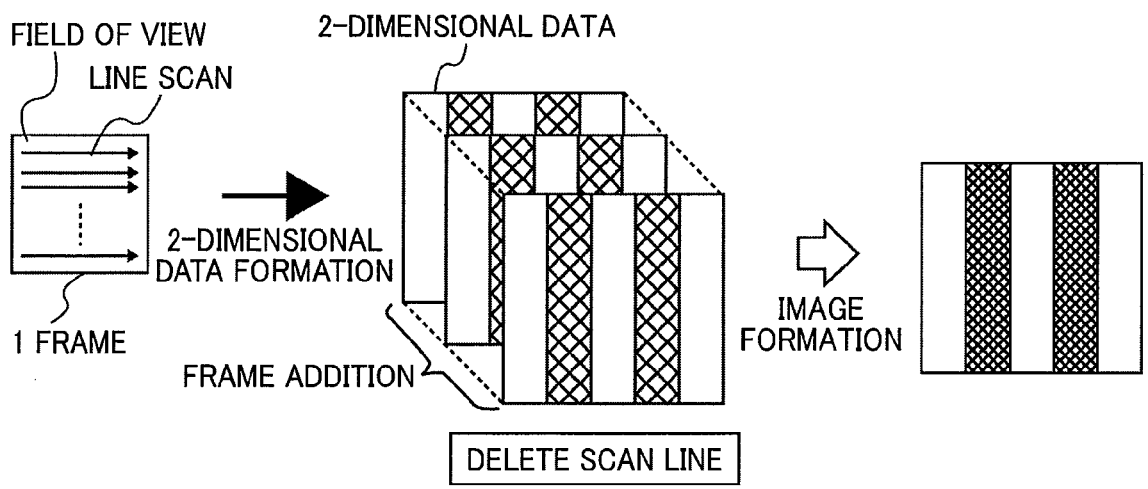
FIG. 3 is an explanatory diagram of procedures of obtaining an image according to the first embodiment.

First, a scan speed for the automatic focus correction is set (S1). At this time, the scan speed is set at 5 msec per frame that is faster than 40 msec per frame (normal speed) in a length measurement step. One frame is herein a unit used when the field of view of the microscope is thoroughly scanned as shown in FIG. 3. An S/N ratio is usually low when obtaining a signal of only one frame. Thus, the frame scan is repeated three times in the focus correction to form an image by adding the signals of three frames.

Figure 4:
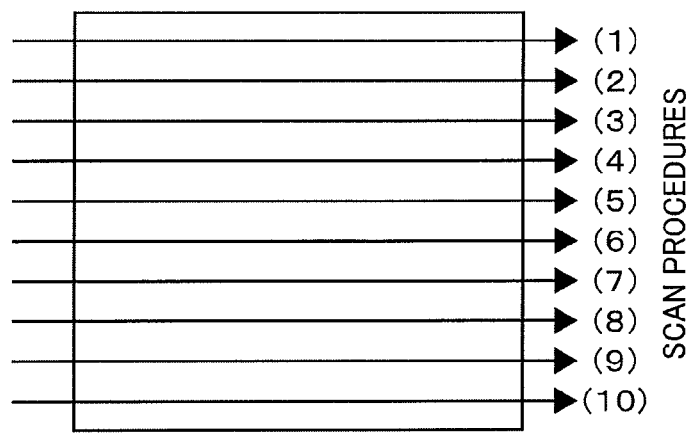
FIG. 4 is an explanatory diagram for showing scan procedures at the time of the length measurement according to the first embodiment.
Figure 5:
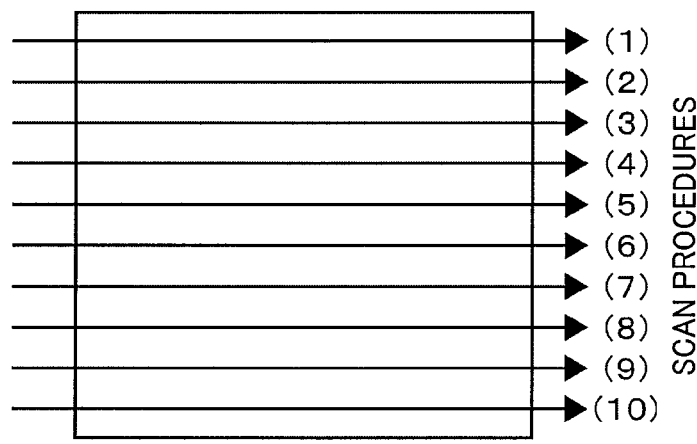
FIG. 5 an explanatory diagram for showing scan procedures at the time of the automatic focus/astigmatism correction according to the first embodiment.

In the case of the high-speed scan as in the embodiment, the less number of frames leads to a decrease in a total dose amount as compared to an image obtained by conventional automatic focus/astigmatism correction, and possibly results in an increase in noise of the image. Thus, the embodiment employs 24 frames obtained by multiplying the number of frames by a ratio of 8 to increase the speed as compared to the normal automatic focus/astigmatism correction. By comparison, a higher S/N ratio is required in the length measurement step, and thus the number of frames is generally 8 to 16. It should be noted that scan procedures are not changed even in the automatic focus correction of the embodiment. Although the scan method in the embodiment is shown in each of FIG. 4 and FIG. 5, the scanning is carried out from the upper side in each case.

Figure 11:
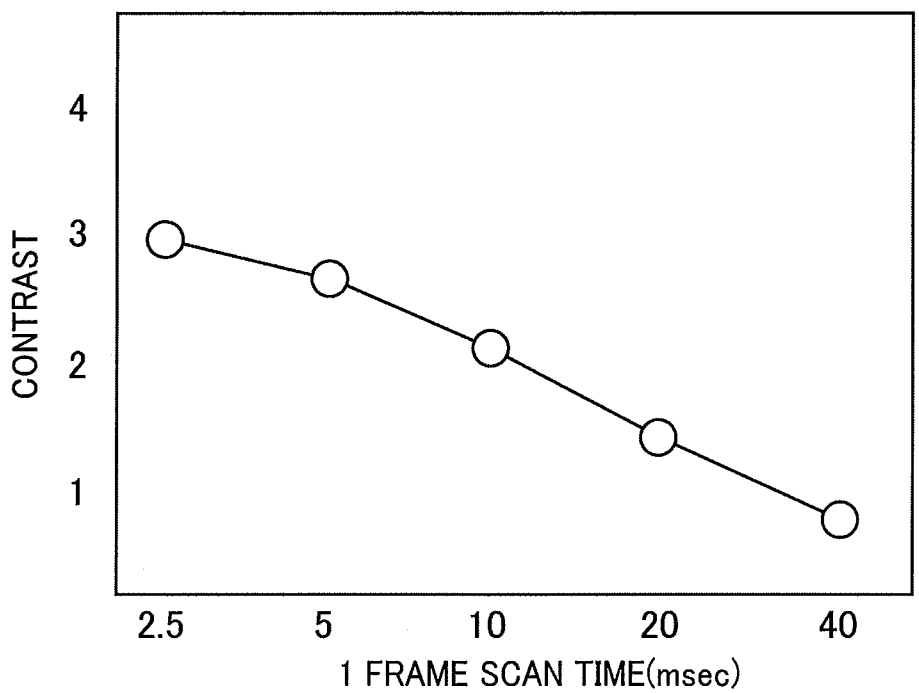
FIG. 11 is an explanatory diagram for showing effects of high-speed scan according to the first embodiment.

FIG. 11 shows effects obtained by increasing the speed. Given that the magnitude of signal intensity of white bands with respect to that of space portions is defined as contrast, it can be found that the contrast is improved by reducing the scan time per frame, namely, by increasing the scan speed. This is effective for high-accuracy focus or astigmatism correction.

It has been known that the high-speed scan carried out in the embodiment is effective for the local charge-up. However, the image is distorted depending on the conditions of the high-speed scan due to the impacts of a response from the detector or 50 Hz noise. Thus, there is a case that an image different from conventional ones is obtained.

This fact causes a problem when obtaining a length measurement image for which a highly-stable length measurement value is required, and thus the high-speed scan has not actually been carried out. The high-speed scan does not cause a major problem in the focus correction and the astigmatism correction using the contrast and position of an image, instead of a pattern shape. Therefore, the high-speed scan faster than that for the length measurement step becomes possible only in the focus/astigmatism correction step, and reduction of the image contrast due to the local charge-up generated during scanning can be suppressed by performing the high-speed scan. This leads to prevention of focus errors at the time of the length measurement, and high-accuracy length measurement can be realized.

Next, after moving to an automatic focus region (S2), the automatic focus is started (S3). Next, scan image data are obtained while changing a current value supplied to each stigma coil in the x direction and the y direction (S4). The electron beam is preferably small in the probe diameter on the sample, and the probe shape is preferably almost a perfect circle. The stigma coil is a coil incorporated in the astigmatism correction device, and functions to adjust the probe shape to be formed in almost a perfect circle. While the obtained scan image is observed, the current value supplied to the stigma coil is obtained from the current value to obtain a clear image (S5), and the current value is set to the stigma coil (S6) to perform the astigmatism correction. The astigmatism correction is not carried out depending on the sample in some cases. For example, the astigmatism correction is not carried out for a sample that is not charged up. Because the astigmatism is generated due to the magnetic heterogeneity of material and charge-up to the diaphragm, and is not generated in the sample that is not charged up. Next, secondary electrons generated while changing the exciting conditions of the objective lens 5 are detected by the detector 6, and image data with different exciting current of the objective lens 5 are obtained (S7).

The evaluation value of the definition of each image is calculated from the sharpness of plural image profiles obtained (S8). The maximum value among the calculated evaluation values is determined as a focal point to determine the optimum exciting current for the focal point, and the optimum exciting conditions are set to the objective lens 5 (S9). The focal point means a state in focus. As described above, the focus/astigmatism correction method is referred to as a contrast method.

Next, after moving to the length measurement region (S10), and the scan speed is switched to that for the length measurement (S11). With the use of the deflector 4, the sample is scanned with the electron beam generated by the electron gun 1, and the generated secondary electrons are detected by the secondary electron detector 6. The dimension of the pattern is measured by an image obtaining portion 11 on the basis of the secondary electron signals detected by the detector 6 (S12). When an image is to be continuously obtained at another length measurement point (No), the same processes are performed from the step S3 where the automatic focus is started, after moving to the next automatic focus region (S13). The scanning electron microscope is provided with a scan mechanism for scanning at a high speed.

Figure 6:
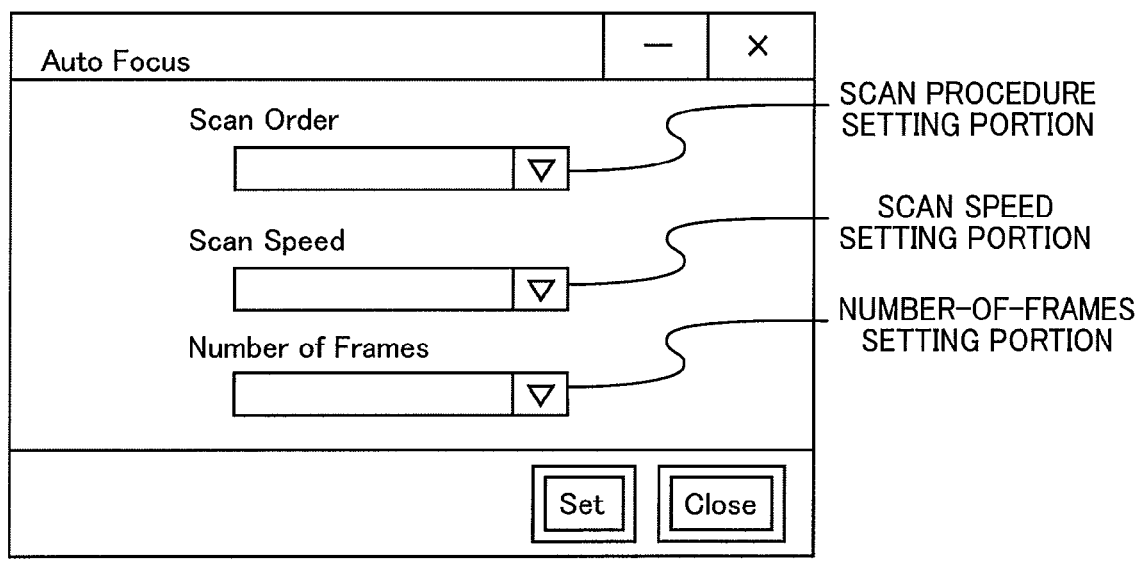
FIG. 6 shows an example of a screen for setting conditions at the time of the automatic focus/astigmatism correction according to the first embodiment.

A setting screen in the embodiment is shown in FIG. 6. The screen is displayed on the monitor 7. When setting the scan procedures and scan speed in the automatic focus/astigmatism correction and those in the length measurement, they can be selected from predetermined plural scan methods and scan speeds. In addition, an operator can manually set the scan procedures and the values of the scan speeds. Further, the number of frames for adjusting the total dose amount can be set.

The amount of charge-up per line scan is suppressed by the high-speed scan and the relaxation time of the charge-up is shortened in the embodiment, so that the impacts of the charge-up can be reduced. Therefore, the embodiment is effective for a resist sample susceptible to the impacts of the charge-up. According to the embodiment, the reproducibility of the length measurement of the resist lines of 20 chips on the wafer was improved from 0.4 nm to 0.3 nm. It should be noted that this can be effectively applied to both or either of the focus correction and the astigmatism correction. Further, not only the dimensions of the lines, but also a 2-dimensional shape may be used as sample information, and the sample information can applied to identification of foreign substances.

According to the embodiment, the amount of charge-up of the charged beam can be reduced by increasing the scan speed. Thus, it is possible to provide a charged beam device by which the accuracy is improved in both or either of the focus correction and the astigmatism correction, and a precise image of the sample surface pattern can be obtained.

Second Embodiment

Figure 7:
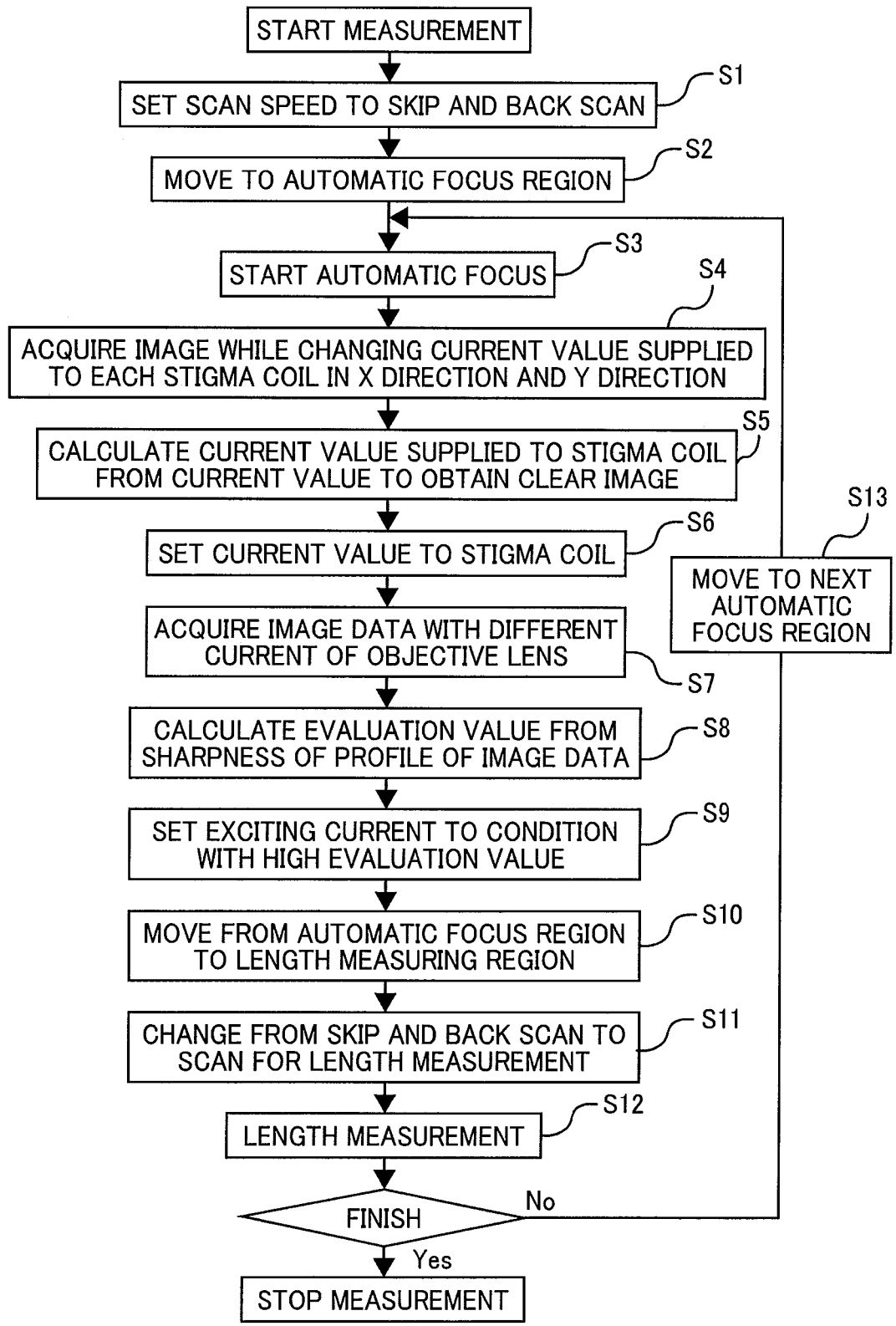
FIG. 7 is a flowchart for showing processing procedures of automatic focus/astigmatism correction and length measurement according to a second embodiment.

A second embodiment will be described using a flowchart of FIG. 7. The scanning electron microscope used in the second embodiment has the same configuration as FIG. 1. It should be noted that matters described in not the second embodiment but the first embodiment are similarly applied to the second embodiment.

In the second embodiment, the scan procedures are set in the automatic focus/astigmatism correction in accordance with the contrast method. In this case, the scan procedures are set to skip and back scan (Step 1:S1), and a skip interval is selected. The skip interval is set at the integral multiple (excluding 1) of an interval between scan lines to be scanned. At this time, "skip and back scan" is a method to control in such a manner that the electron beam scan is skipped at constant or different intervals, and then regions where the impacts of the charge-up by the previous scan are relaxed are scanned as many as possible. This scan method is employed in the automatic focus/astigmatism correction, so that the impacts of the local charge-up between the scan lines can be suppressed. In addition, it is not necessary to thin the scan lines by employing the skip and back scan, and thus scan failures at pattern edge portions can be prevented. This leads to prevention of focus errors in the length measurement step, and high-accuracy length measurement can be realized.

Figure 8:
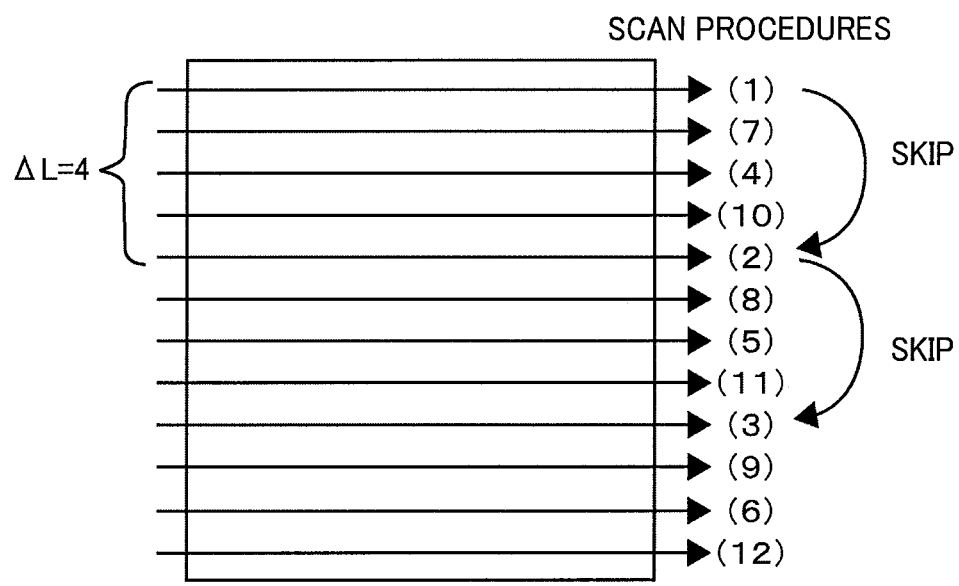
FIG. 8 is an explanatory diagram for showing scan procedures at the time of the automatic focus/astigmatism correction according to the second embodiment.
Figure 8:
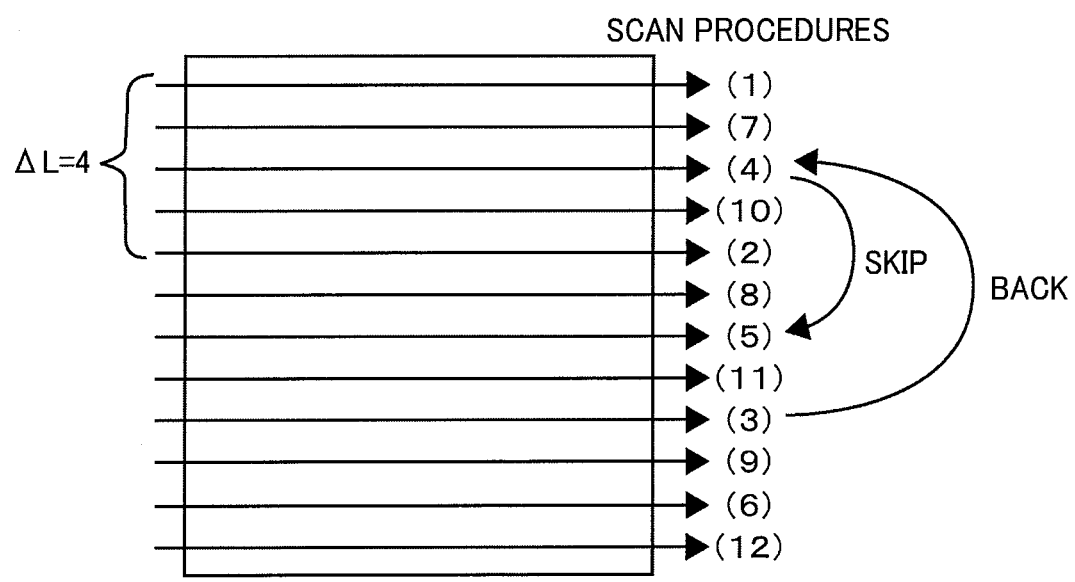

FIG. 8 conceptually shows the scan procedures in the embodiment. The number of scan lines is reduced to 12 lines although 512 lines are actually scanned. Unlike the length measurement, the scanning is carried out at larger intervals, namely, by skipping 3 scan lines, and then the back scan is carried out so as to scan the skipped scan lines. In this case, the scan procedures (1)→(2)→(3) are referred to as "skip scan" in which some lines in the middle are sipped, and the scan procedures (3)→(4) are referred to as "back scan" because the scan position is moved backward. Thus, the two types of scan are collectively referred to as "skip and back scan".

Specifically, "skip and back scan" is selected on the screen shown in FIG. 6 similar to the first embodiment and the number of lines to be skipped is set first.

Next, after moving to an automatic focus/astigmatism correction region (S2), the focus/astigmatism correction is performed. Further, after moving to the length measurement region, the length measurement is performed. Steps S2 to S13 are the same as the explanation in FIG. 2. The scanning electron microscope is provided with a scan mechanism which skips the arbitrary number of scan lines, and then returns to an arbitrary thinned line whose charge-up was relaxed.

Figure 12:
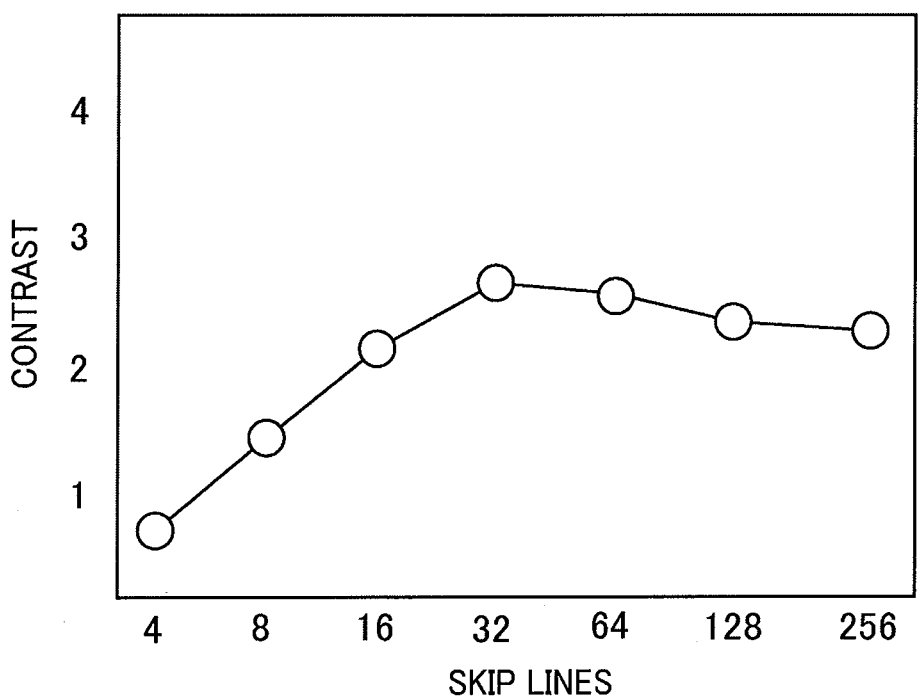
FIG. 12 is an explanatory diagram for showing effects of skip and back scan according to the second embodiment.

FIG. 12 shows effects obtained by the skip and back scan. The contrast is more improved as the number of skipped lines is increased. However, there exists a maximum value. Accordingly, the scanning was performed by skipping 32 lines in the embodiment. The number of skipped lines is preferably 8 or more.

It has been known that "skip and back scan" carried out in the embodiment is effective for the local charge-up. However, the image is distorted depending on the scan conditions due to the impacts of a magnetic response from the deflector or 50 Hz noise. Thus, there is a case that an image different from conventional ones is obtained. As similar to the first embodiment, this fact causes concern when obtaining a length measurement image for which a highly-stable length measurement value is required. However, this fact does not cause a major problem in the focus correction and the astigmatism correction using the contrast and position of an image, instead of a pattern shape. Therefore, the present invention is effective because the scanning can be performed in different procedures while providing the larger skip intervals only in the focus/astigmatism correction step than those in the length measurement step.

According to the embodiment, the reproducibility of the length measurement of resist holes of 20 chips on the wafer was improved from 0.6 nm to 0.4 nm. It should be noted that the skip and back scan of the second embodiment can be combined with the high-speed scan of the first embodiment, and is especially effective to suppress the impacts of high-current charge-up.

According to the embodiment, it is possible to provide a charged beam device by which the amount of charge-up of the charged beam can be reduced by the skip and back scan, the accuracy is improved in both or either of the focus correction and the astigmatism correction, and a precise image of the sample surface pattern can be obtained.

Third Embodiment

A third embodiment will be described below. It should be noted that matters described in not the third embodiment but the first and second embodiments are similarly applied to the third embodiment.

In the above-described embodiments, although the scan method was changed, the total dose amount was the same as the conventional case. The total dose amount serves as an average charge-up index around an observed region other than the local charge-up described above. A large total dose amount causes focus changes due to the charge-up. Accordingly, suppression of the total dose amount can be effective countermeasures against the charge-up. The suppression of the total dose amount causes an increase in noise, leading to concerns about deterioration of accuracy. However, the image contrast is improved by reducing the impacts of the local charge-up in the embodiment, and thus the total dose amount can be reduced.

In the embodiment, the scan speed is set at 5 msec per frame, and the number of frames is limited to 18 frames that is smaller than the number (24 frames=3 frames×40 msec/5 msec) obtained by multiplying a ratio to increase the speed. Accordingly, the total dose amount is reduced to 2/3. The contrast method was used in the focus/astigmatism correction even in the embodiment. According to the embodiment, the reproducibility of the length measurement of the resist lines of 20 chips on the wafer was improved from 0.4 nm to 0.25 nm. This suggests that the effects of the suppression of the average charge-up led to improvement of accuracy, irrespective of an increase in noise. It should be noted that along with the reduction of the number of frames, the throughput was also improved from 40 sheets per hour to 43 sheets per hour.

The same effects as the first embodiment can be obtained even in the third embodiment. Further, the effects of improvement of the throughput can be obtained by reducing the total dose amount (the number of frames) of the charged beam to obtain an image.

Fourth Embodiment

A fourth embodiment will be described below. It should be noted that matters described in not the fourth embodiment but the first to third embodiments are similarly applied to the fourth embodiment.

An increased amount of current is one option for high throughput. An increased amount of current can secure the S/N ratio to determine the contrast of an image with the less number of frames, and thus the high-speed scan becomes possible. A control factor that determines the S/N ratio is the total dose amount, and the control factors of the total dose amount are probe current, a scan speed, and the number of frames.

The amount of current is increased from 10 pA to 60 pA in the embodiment. Accordingly, the high-speed scan can be expected, but the impacts of the local charge-up become apparent. In order to equalize the total dose amount at 60 pA, it is necessary to obtain an image using 0.5 frame, which generates a contradiction. Thus, the high-speed scan with an increased amount of current is essential, and the scan speed is set at 10 msec per frame in the embodiment. Accordingly, it is only necessary to obtain an image using 2 frames. Further, the impacts of the local charge-up can be reduced. As described above, the high-speed scan in the focus/astigmatism correction is a fundamental method along with an increased amount of current. It should be noted that the number of frames in the length measurement step at the time was 2 frames at a standard scan speed of 40 msec per frame. The contrast method was used in the focus/astigmatism correction even in the embodiment. According to the embodiment, the reproducibility of the length measurement of the resist holes of 20 chips on the wafer could be improved to 0.4 nm. In addition, the throughput could be also improved from 40 sheets per hour to 50 sheets per hour.

The same effects as the first embodiment can be obtained even in the fourth embodiment. Further, the effects of improvement of the throughput can be obtained by performing the high-speed scan while increasing the amount of current of the charged beam.

Fifth Embodiment

A fifth embodiment will be described below. It should be noted that matters described in not the fifth embodiment but the first to fourth embodiments are similarly applied to the fifth embodiment.

Figure 9:
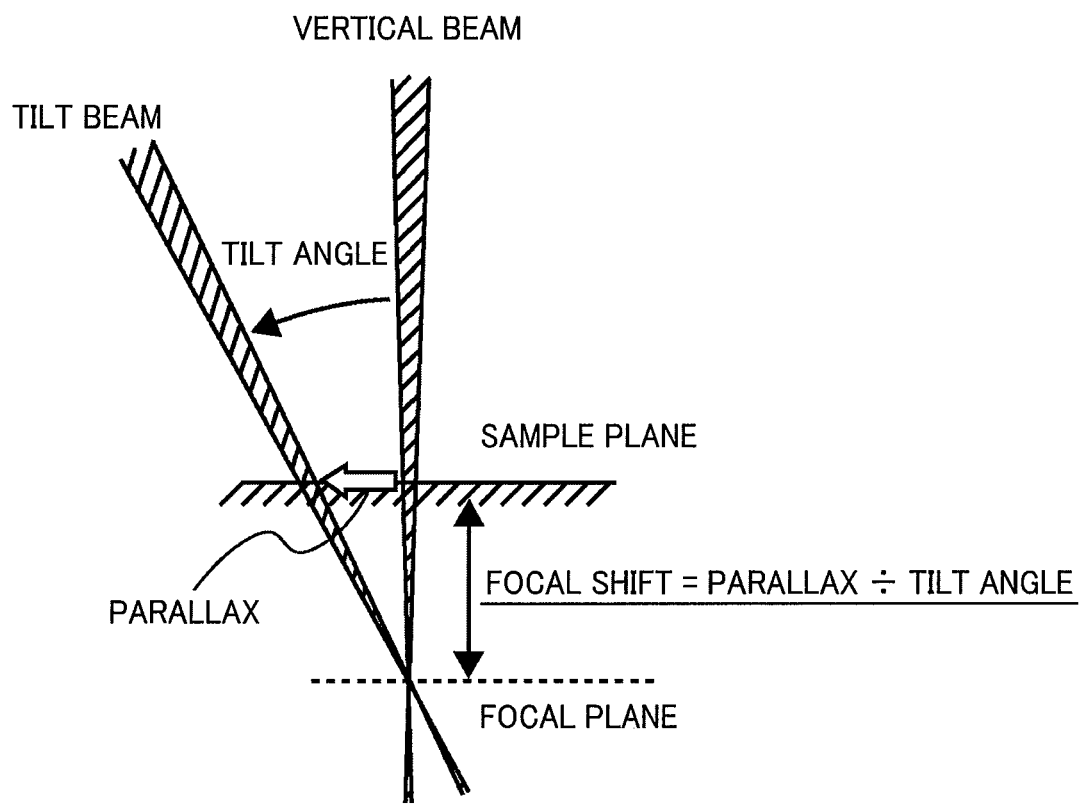
FIG. 9 is an explanatory diagram of the principle of parallax method according to a fifth embodiment.

A parallax method is used as a focus/astigmatism correction method in the embodiment. The principle of the parallax method is shown in FIG. 9. If the beam is tilted in a state where a focus plane is shifted, the beam position on the sample surface is changed (parallax occurs), and the focus can be calculated. In addition, the astigmatism can be also measured by changing the tilt direction. This method is characterized in that the focus/astigmatism measurement becomes possible even for an image whose S/N ratio is poor. Specifically, it is necessary for the parallax method to measure the positions of pattern edges in the image, and reduction of the contrast at the edge portions due to the local charge-up leads to deterioration in accuracy. Thus, the parallax method can be more effectively used by combining the scan methods of the other embodiments with the parallax method.

An image is obtained using only 8 frames at 10 msec per frame in the embodiment (if the total dose amount is not changed, 12 frames=3 frames×40 msec/10 msec). Accordingly, the suppression of the impacts of the average charge-up when obtaining an image using the less number of frames, and the suppression of the impacts of the local charge-up by devising the scan method can be realized. As a result of the embodiment, the reproducibility of the length measurement of the resist holes of 20 chips on the wafer could be improved to 0.4 nm. In addition, the throughput could be also improved to 55 sheets per hour.

The same effects as the first embodiment can be obtained even in the fifth embodiment. Further, the effects of improvement of the throughput can be obtained because the focus/astigmatism correction is possible even for an image whose S/N ratio is poor and the number of frames for producing an image can be reduced by using the parallax method as a focus/astigmatism correction method.

Sixth Embodiment

A sixth embodiment will be described below. It should be noted that matters described in not the sixth embodiment but the first to fifth embodiments are similarly applied to the sixth embodiment.

The number of frames was reduced to suppress the average charge-up by further reducing the total dose amount in the embodiment. Specifically, the number of frames was 2 frames at a scan speed of 40 msec per frame. The contrast method was used in the focus/astigmatism correction even in the embodiment. Since "skip and back scan" can suppress the impacts of the local charge-up, the contrast similar to the conventional technique can be obtained even if the number of frames is reduced. Specifically, high-accuracy automatic focus/astigmatism correction becomes possible even when the number of frames is set smaller than that in the scan procedures when obtaining a standard shape and composition information. As a result of the present invention, the reproducibility of the length measurement of the resist holes of 20 chips on the wafer could be improved to 0.4 nm. In addition, the throughput could be also improved from 40 sheets per hour to 43 sheets per hour.

The same effects as the second embodiment can be obtained even in the sixth embodiment. Further, the effects of improvement of the throughput can be obtained by reducing the total dose amount (the number of frames) of the charged beam to obtain an image.

REFERENCE SIGNS LIST

1 . . . electron gun
2 . . . focusing lens

3 ... astigmatism correction device
4 ... deflector
5 ... objective lens
6 ... detector
7 ... monitor
8 ... electron beam deflection control portion
9 ... length measurement/automatic focus/astigmatism correction setting switching portion
10 ... focus control portion
11 ... CPU (image processing portion)
1001 ... wafer
1002 ... chip
1003 ... device region
1004 ... scribe region
1005 ... length measurement region
1006 ... focus correction region
1007 ... sample stage

What is claimed is:

1. A charged beam device comprising:
a charged beam generator;
a deflection control portion which allows a charged beam generated by the charged beam generator to scan;
a focus control portion and an astigmatism correction portion for the charged beam; and
an image processing portion which processes an image of surface information of a sample when irradiating the charged beam onto the sample, wherein
there is further provided a switch portion which switches scan conditions for the charged beam when obtaining pattern information of the sample surface and scan conditions for the charged beam when performing both or either of focus correction and astigmatism correction, and a scan speed in the scan conditions for the charged beam when performing both or either of the focus correction and the astigmatism correction is set at a value larger than that in the scan conditions for the charged beam when obtaining the pattern information of the sample surface.

2. The charged beam device according to claim 1, wherein a total dose amount of the charged beam to obtain one image processed by the image processing portion is equally set between when obtaining the pattern information of the sample surface and when performing both or either of the focus correction and the astigmatism correction.

3. The charged beam device according to claim 1, wherein the total dose amount of the charged beam to obtain one image processed by the image processing portion when performing both or either of the focus correction and the astigmatism correction is set smaller than that when obtaining the pattern information of the sample surface.

4. The charged beam device according to claim 3, wherein the total dose amount of the charged beam is set using the number of frames configuring the one image.

5. The charged beam device according to claim 1, wherein the amount of current of the charged beam when performing both or either of the focus correction and the astigmatism correction is set at a value larger than that when obtaining the pattern information of the sample surface.

6. The charged beam device according to claim 1, wherein the charged beam is set to be tilted relative to the sample surface when performing both or either of the focus correction and the astigmatism correction.

7. A charged beam device comprising:
a charged beam generator;
a deflection control portion which allows a charged beam generated by the charged beam generator to scan;
a focus control portion and an astigmatism correction portion for the charged beam; and
an image processing portion which processes an image of surface information of a sample when irradiating the charged beam onto the sample, wherein
there is further provided a switch portion which switches scan conditions for the charged beam when obtaining pattern information of the sample surface and scan conditions for the charged beam when performing both or either of focus correction and astigmatism correction, and a scan line interval in the scan conditions for the charged beam when performing both or either of the focus correction and the astigmatism correction is set in such a manner that scanning is performed at the integral multiple (excluding 1) of the scan line interval for scanning, and then the scanning is performed by returning to a skipped position for scanning.

8. The charged beam device according to claim 7, wherein the total dose amount of the charged beam to obtain one image processed by the image processing portion when performing both or either of the focus correction and the astigmatism correction is set smaller than that when obtaining the pattern information of the sample surface.

9. The charged beam device according to claim 7, wherein the total dose amount of the charged beam is set using the number of frames configuring the one image.

10. The charged beam device according to claim 7, wherein the amount of current of the charged beam when performing both or either of the focus correction and the astigmatism correction is set at a value larger than that when obtaining the pattern information of the sample surface.

11. The charged beam device according to claim 7, wherein the charged beam is set to be tilted relative to the sample surface when performing both or either of the focus correction and the astigmatism correction.

12. A charged beam device comprising:
a charged beam generator;
a deflection control portion which allows a charged beam generated by the charged beam generator to scan;
a focus control portion and an astigmatism correction portion for the charged beam; and
an image processing portion which processes an image of surface information of a sample when irradiating the charged beam onto the sample, wherein
there is further provided a switch portion which switches scan conditions for the charged beam when obtaining pattern information of the sample surface and scan conditions for the charged beam when performing both or either of focus correction and astigmatism correction, a scan speed in the scan conditions for the charged beam when performing both or either of the focus correction and the astigmatism correction is set at a value larger than that in the scan conditions for the charged beam when obtaining the pattern information of the sample surface, and a scan line interval in the scan conditions for the charged beam when performing both or either of the focus correction and the astigmatism correction is set in such a manner that scanning is performed at the integral multiple (excluding 1) of the scan line interval for scanning, and then the scanning is performed by returning to a skipped position for scanning.

13. The charged beam device according to claim 12, wherein
the total dose amount of the charged beam to obtain one image processed by the image processing portion when performing both or either of the focus correction and the astigmatism correction is set smaller than that when obtaining the pattern information of the sample surface.

14. The charged beam device according to claim 12, wherein the amount of current of the charged beam when performing both or either of the focus correction and the astigmatism correction is set at a value larger than that when obtaining the pattern information of the sample surface.

15. The charged beam device according to claim 12, wherein the charged beam is set to be tilted relative to the sample surface when performing both or either of the focus correction and the astigmatism correction.

* * * * *